(12) United States Patent
Kim et al.

(10) Patent No.: US 8,530,303 B2
(45) Date of Patent: Sep. 10, 2013

(54) METHOD OF FABRICATING SEMICONDUCTOR DEVICE

(75) Inventors: Jin-Bum Kim, Seoul (KR); Chul-Sung Kim, Seongnam-si (KR); Yu-Gyun Shin, Seongnam-si (KR); Dae-Yong Kim, Yongin-si (KR); Joon-Gon Lee, Seoul (KR); Kwang-Young Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 13/243,147

(22) Filed: Sep. 23, 2011

(65) Prior Publication Data
US 2012/0171826 A1 Jul. 5, 2012

(30) Foreign Application Priority Data
Jan. 5, 2011 (KR) .......... 10-2011-0001073

(51) Int. Cl.
*H01L 21/8249* (2006.01)
(52) U.S. Cl.
USPC ........... 438/229; 438/199; 438/299; 438/682; 257/E21.64; 257/E21.633
(58) Field of Classification Search
USPC ......... 438/199, 229, 299, 682; 257/E21.633, 257/E21.64
See application file for complete search history.

(56) References Cited

U.S. PATENT DOCUMENTS

| 2006/0027876 | A1* | 2/2006 | Jung et al. | 257/369 |
| 2006/0046367 | A1* | 3/2006 | Rotondaro et al. | 438/199 |
| 2008/0009110 | A1* | 1/2008 | Chang et al. | 438/197 |
| 2008/0173934 | A1* | 7/2008 | Lee et al. | 257/327 |
| 2009/0236633 | A1* | 9/2009 | Chuang et al. | 257/190 |
| 2011/0201164 | A1* | 8/2011 | Chung et al. | 438/229 |

FOREIGN PATENT DOCUMENTS

| JP | 2009-164454 | 7/2009 |
| KR | 2001-0008523 | 2/2001 |
| KR | 10-2005-0078104 | 8/2005 |

* cited by examiner

*Primary Examiner* — Thanh V Pham
(74) *Attorney, Agent, or Firm* — Onello & Mello, LLP

(57) ABSTRACT

A method of fabricating a semiconductor includes providing a substrate having a first region and a second region defined therein, forming a first gate and a first source and drain region in the first region and forming a second gate and a second source and drain region in the second region, forming an epitaxial layer in the second source and drain region, forming a first metal silicide layer in the first source and drain region, forming an interlayer dielectric layer on the first region and the second region, forming a plurality of contact holes exposing the first metal silicide layer and the epitaxial layer while penetrating the interlayer dielectric layer, forming a second metal silicide layer in the exposed epitaxial layer, and forming a plurality of contacts contacting the first and second metal silicide layers by filling the plurality of contact holes.

7 Claims, 10 Drawing Sheets

METHOD OF FABRICATING SEMICONDUCTOR DEVICE

CROSS-REFERENCE TO RELATED APPLICATION

This application claims priority under 35 U.S.C. 119 from Korean Patent Application No. 10-2011-0001073 filed on Jan. 5, 2011 in the Korean Intellectual Property Office, the contents of which are herein incorporated by reference in its entirety.

FIELD OF INVENTION

The present invention relates to semiconductor devices, and more particularly to methods of fabricating a semiconductor device.

BACKGROUND

In order to improve operating characteristics of a semiconductor device, many attempts to improve resistance are being made. One approach has been to improve contact resistance between silicide and a silicon substrate.

The most important features of the contact resistance include a work function of silicide and a doping concentration of a silicon substrate because a Schottky barrier height (SBH) is determined by the work function and the doping concentration and the contact resistance is determined by the SBH.

As an example, when silicide of $NiSi_2$ phase is formed in NMOS, the SBH of the PMOS can be relatively increased and resistance can be increased. If PMOS is applied in an eSiGe process, agglomeration of silicide can be generated. Therefore, performance of the semiconductor device can be decreased, and leakage of the device can be increased.

SUMMARY

The present invention provides a fabricating method of a semiconductor device having improved operating characteristics.

In accordance with aspects of the present invention, a blocking layer is formed on a PMOS region of a semiconductor device so that silicide of an NiSi2 phase is formed only on an NMOS region of the semiconductor device. After that, an interlayer dielectric (ILD) and contacts are formed and then silicide is formed on the PMOS region. Therefore, the method can prevent agglomeration of silicide on the PMOS region. Also, silicide having proper work function for PMOS can be formed separately. Contact resistance and performance of both NMOS and PMOS can be improved.

According to an aspect of the present invention, there is provided a method of fabricating a semiconductor device. The method includes providing a substrate having a first region and a second region defined therein, forming a first gate and a first source and drain region in the first region and forming a second gate and a second source and drain region in the second region, forming an epitaxial layer in the second source and drain region, forming a first metal silicide layer in the first source and drain region, forming an interlayer dielectric layer on the first region and the second region, forming a plurality of contact holes exposing the first metal silicide layer and the epitaxial layer by penetrating the interlayer dielectric layer, forming a second metal silicide layer in the exposed epitaxial layer, and forming a plurality of contacts contacting the first and second metal silicide layers by filling the plurality of contact holes.

The forming of the second metal silicide layer can comprise forming the second metal silicide layer after forming the first metal silicide layer, the interlayer dielectric layer, and the plurality of contact holes.

The forming of the first metal silicide layer can comprise performing at least two thermal processes on the substrate.

The performing of the at least two thermal processes can include forming a blocking layer on the substrate in the second region, forming a first metal layer contacting the first source and drain region on the substrate having the blocking layer, selectively forming a first pre-metal silicide layer in the first source and drain region by performing a first thermal process; and changing the first pre-metal silicide layer into the first metal silicide layer by performing a second thermal process at a higher temperature than the first thermal process.

The changing of the first pre-metal silicide layer into the first metal silicide layer can comprise changing the first pre-metal silicide layer into the first metal silicide layer such that a proportion of silicon atoms relative to metal atoms of the first metal silicide layer is greater than a proportion of silicon atoms relative to metal atoms of the first pre-metal silicide layer.

The performing of the second thermal process can comprise performing one of flash annealing and laser annealing.

The forming of the second metal silicide layer can comprise forming a second metal layer contacting the exposed epitaxial layer and performing at least one thermal process on the substrate.

The performing of the at least one thermal process can comprise forming a second pre-metal silicide layer on the exposed epitaxial layer by performing a first thermal process on the substrate having the second metal layer and changing the second pre-metal silicide layer into the second metal silicide layer by performing a second thermal process at a higher temperature than the first thermal process.

After the forming of the interlayer dielectric layer, the method can further include exposing the first and second gates by removing a portion of the interlayer dielectric layer, forming first and second recesses by selectively removing the first and second gates, conformally forming high-k dielectric materials on bottom surfaces and opposite sidewalls of the first and second recesses, forming first and second high-k metal gates by forming metallic materials on the high-k dielectric materials to fill the first and second recesses, and forming an additional interlayer dielectric layer on the substrate having the first and second high-k metal gates. The forming of the plurality of contact holes can comprise forming the plurality of contact holes such that the plurality of contact holes penetrate the interlayer dielectric layer and the additional interlayer dielectric layer.

According to another aspect of the present invention, there is provided a method of fabricating a semiconductor device. The method includes providing a substrate having a first region and a second region defined therein, forming a first gate and a first source and drain region in the first region and forming a second gate and a second source and drain region in the second region, forming a first epitaxial layer extending from a top surface of the substrate in the first source and drain region, forming a second epitaxial layer in the second source and drain region, forming a first metal silicide layer in the first epitaxial layer, forming an interlayer dielectric layer on the first region and the second region, and forming a plurality of contact holes exposing the first metal silicide layer and the second epitaxial layer while penetrating the interlayer dielectric layer, wherein a second metal silicide layer is formed in the exposed second epitaxial layer, and a plurality of contacts contacting the first and second metal silicide layers are formed by filling the plurality of contact holes.

The forming of the second metal silicide layer can comprise forming the second metal silicide layer after forming the first metal silicide layer, the interlayer dielectric layer, and the plurality of contact holes.

The forming of the first metal silicide layer can comprise performing at least two thermal processes on the substrate.

The performing of the at least two thermal processes can comprise forming a blocking layer on the substrate in the second region, forming a first metal layer contacting the first epitaxial layer epitaxial layer on the substrate having the blocking layer, selectively forming a first pre-metal silicide layer in the first epitaxial layer by performing a first thermal process; and changing the first pre-metal silicide layer into the first metal silicide layer by performing a second thermal process at a higher temperature than the first thermal process.

The changing of the first pre-metal silicide layer into the first metal silicide layer can comprise changing the first pre-metal silicide layer into the first metal silicide layer such that a proportion of silicon atoms relative to metal atoms of the first metal silicide layer is greater than a proportion of silicon atoms relative to metal atoms of the first pre-metal silicide layer.

The performing of the second thermal process can comprise performing one of flash annealing and laser annealing.

The forming of the second metal silicide layer can comprise forming a second metal layer contacting the exposed second epitaxial layer and forming a second pre-metal silicide layer on the exposed second epitaxial layer by performing a first thermal process on the substrate.

After the performing of the first thermal process, the method can further comprise changing the second pre-metal silicide layer into the second metal silicide layer by performing a second thermal process at a higher temperature than the first thermal process.

The forming of the interlayer dielectric layer can further comprise exposing the first and second gates by removing a portion of the interlayer dielectric layer, forming first and second recesses by selectively removing the first and second gates, conformally forming a high-k dielectric material on bottom surfaces and opposite sidewalls of the first and second recesses, forming first and second high-k metal gates by forming a metallic material on the high-k dielectric material to fill the first and second recesses, and forming an additional interlayer dielectric layer on the substrate having the first and second high-k metal gates. The forming of the plurality of contact holes can comprise forming the plurality of contact holes such that the plurality of contact holes penetrate the interlayer dielectric layer and the additional interlayer dielectric layer.

The forming of the first epitaxial layer and the second epitaxial layer can comprise forming the second epitaxial layer and then forming a blocking layer on the second region of the substrate having the second epitaxial layer and selectively forming the first epitaxial layer on the first source and drain region.

In accordance with another aspect of the invention, provided is a method of fabricating a semiconductor device. The method comprises providing a substrate having a NMOS region and a PMOS region defined therein, forming a first gate and first source and drain regions in the PMOS region, forming a second gate and a second source and drain regions in the NMOS region, wherein the second source and drain region have a different shape than the first source and drain region, forming a blocking layer over the PMOS region, while exposing the NMOS region, forming a first silicide layer on the first source and drain region, after forming the first silicide layer, forming a second metal silicide layer on the blocking layer above the second source and drain region, and forming a plurality of contacts contacting the first and second metal silicide layers.

The method can further comprise, before forming the plurality of contacts, forming an interlayer dielectric layer on the NMOS region and the PMOS region and forming a plurality of contact holes exposing the first metal silicide layer and the epitaxial layer by penetrating the interlayer dielectric layer.

The second metal silicide layer can be formed in the exposed epitaxial layer.

The method can further comprise forming the plurality of contacts by filling the plurality of contact holes after forming the second metal silicide layer.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION OF EXEMPLARY EMBODIMENTS

Figure 1:
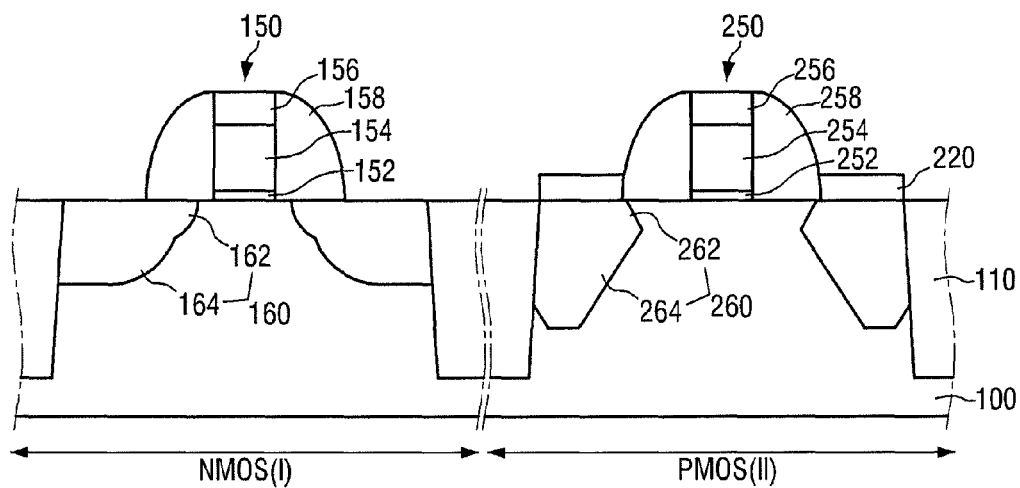
FIGS. 1 to 6 are cross-sectional views sequentially illustrating intermediate stages in an embodiment of a method of fabricating a semiconductor device, according to an aspect of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. In the drawings, the thickness of layers and regions are exaggerated for clarity.

It will be understood that when an element is referred to as being "connected to," or "coupled to" another element or layer, it can be directly on or connected to the other element or intervening elements or layers may be present. In contrast, when an element is referred to as being "directly connected to" or "directly coupled to" another element or layer, there are no intervening elements present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An embodiment of a method of fabricating a semiconductor device according to aspects of the present invention will now be described with reference to FIGS. 1 to 6. FIGS. 1 to 6 are cross-sectional views sequentially illustrating intermediate stages in the method of fabricating a semiconductor device according to this embodiment.

Referring to FIG. 1, a substrate 100 having a first region I and a second region II defined therein is provided. A first gate 150 and a first source and drain region 160 are formed in the first region I, a second gate 250 and a second source and drain region 260 are formed in the second region II, and an epitaxial layer 220 is formed in the second source and drain region 260.

The substrate 100 may be a silicon substrate, a silicon on insulator (SOI) substrate, or a silicon germanium substrate. The first region I of the substrate 100 may be, for example, an NMOS region where an NMOS transistor is formed, and the second region II may be, for example, a PMOS region where a PMOS transistor is formed.

The first source and drain region 160 may include a first lightly doped impurity region 162 and a first heavily doped impurity region 164, and the second source and drain region 260 may include a second lightly doped impurity region 262 and a second heavily doped impurity region 264. While the illustrated embodiment shows that the first source and drain region 160 and the second source and drain region 260 have a lightly diffused drain (LDD) structure, the invention is not limited thereto. For example, the first source and drain region 160 and the second source and drain region 260 may have a double diffused drain (DDD) structure, a mask islanded double diffused drain (MIDDD) structure, a mask LDD (MLDD) structure, or a lateral double-diffused MOS (LDMOS) structure. In the illustrated embodiment, the first source and drain region 160 and the second source and drain region 260 having different shapes are formed in the NMOS region I and the PMOS region II. However, the first source and drain region 160 and the second source and drain region 260 may have the same shape according to the use of a semiconductor device.

The first gate 150 may be formed by sequentially stacking a first gate insulating layer 152, a first gate electrode 154, and a first gate mask 156 on the substrate 100. A first spacer 158 may be formed on opposite sidewalls of the first gate 150. Likewise, the second gate 250 may be formed by sequentially stacking a second gate insulating layer 252, a second gate electrode 254, and a second gate mask 256 on the substrate 100. A second spacer 258 may be formed on opposite sidewalls of the second gate 250. The first and second gates 150 and 250 are illustrated only by way of example, and not by way of limitation. The first and second gates 150, 250 they may have various structures in various embodiments.

The epitaxial layer 220 may include, for example, SiGe. More specifically, in a case where the epitaxial layer 220 is formed in the PMOS region using SiGe, stress may be applied to a channel region of the substrate 100 due to a difference in the lattice length between Si and Ge. The stress applied to the channel region may improve hole mobility, thereby improving the performance of the semiconductor device. Here, the epitaxial layer 220 may be formed by an epitaxial growth process, according to such processes that are known in the art.

Figure 2:
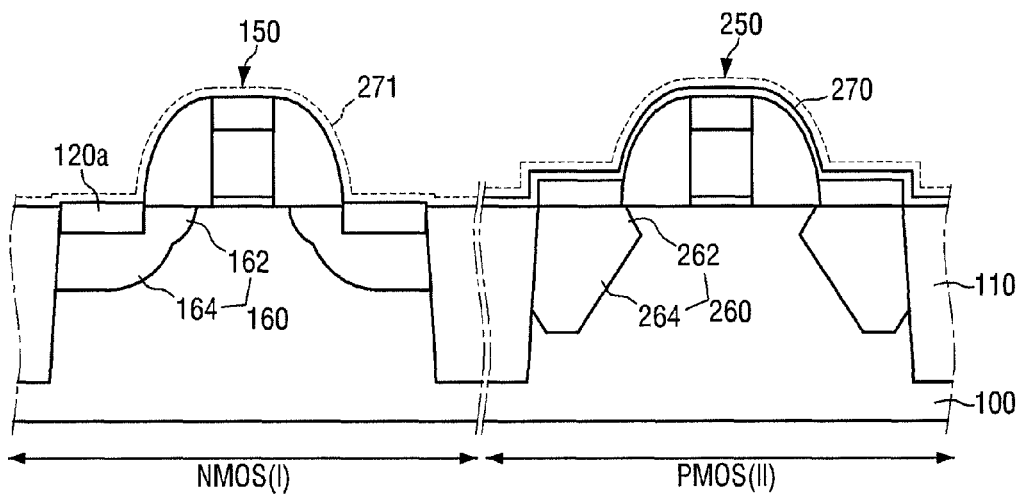
Figure 3:
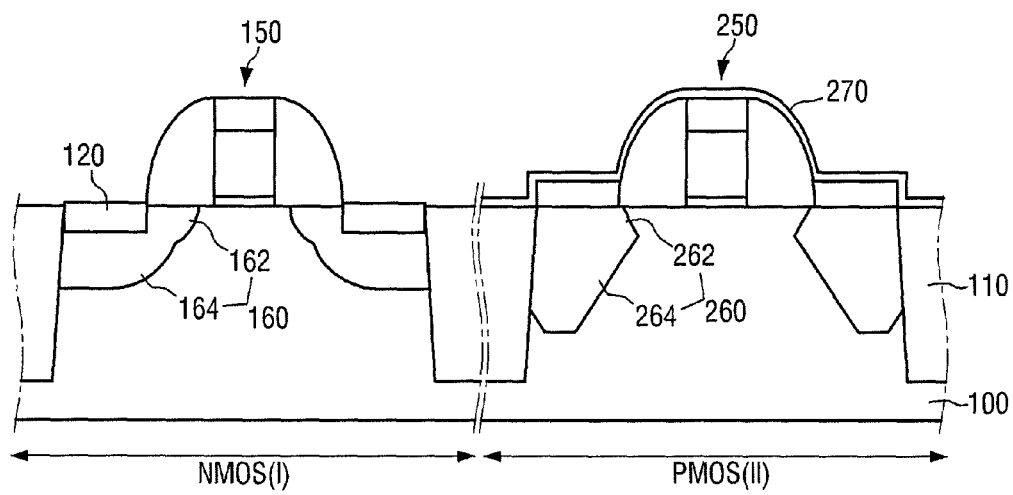

Referring to FIGS. 2 and 3, a first metal silicide layer 120 is formed in the first source and drain region 160. Here, the forming of the first metal silicide layer 120 may comprise performing a thermal process on the substrate 100 at least two times.

First, referring to FIG. 2, a blocking layer 270 is formed on the second region II, and a first metal layer 271 contacting the first source and drain region 160 is formed on the substrate 100 having the blocking layer 270. This is followed by performing a first thermal process, thereby selectively forming a first pre-metal silicide layer 120a in the first source and drain region 160.

More specifically, the blocking layer 270 is selectively formed on the second region II, thereby preventing the second source and drain region 260 in the PMOS region II from contacting the first metal layer. In an exemplary embodiment, the selective forming of the blocking layer 270 on the second region II may be accomplished by forming a blocking layer forming material layer on the entire surface of the substrate 100 and removing the blocking layer forming material layer on the NMOS region I by photolithography. As examples, the blocking layer 270 may be formed of a nitride layer or an oxide layer.

Next, the first metal layer (not shown) may be formed on the NMOS region I exposed by the blocking layer 270. For example, the first metal layer may include any one of Ni, Pt, Ti, Ru, Rh, Co, Hf, Ta, Er, Yb and W, or combinations thereof. In the embodiment of FIGS. 1-6 of the present invention, the first metal layer is described with regard to a case of using Ni. The first metal layer may be formed by, for example, physical vapor deposition (PVD), chemical vapor deposition (CVD), or atomic layer deposition (ALD). A thickness of the first metal layer may be determined in consideration of a thickness of the silicon under the metal layer, which is consumed during first and second thermal processes to be performed later. For example, the first metal layer may be formed to a thickness in which the first source and drain region 160 may not be completely consumed.

Next, a first thermal process is performed to form a first pre-metal silicide layer 120a. For example, during the first thermal process, the substrate 100 may be heated at a temperature of approximately 350° C. or less, for approximately 20 seconds. Here, the first thermal process may be performed by rapid thermal annealing (RTA). As described above, the first source and drain region 160 is allowed to react with the first metal layer in the first thermal process, thereby forming the first pre-metal silicide layer 120a.

Although not shown, before performing the first thermal process, a first capping layer may be formed on the substrate 100 having the first metal layer to improve the morphology of the metal silicide layer. Here, the first capping layer may be formed of, for example, an oxide layer or a nitride layer.

The first pre-metal silicide layer 120a may have a metal-to-silicon atom ratio of 1 or greater. Here, the metal-to-silicon atom ratio may mean "number of metal atoms/number of silicon atoms." That is to say, the first pre-metal silicide layer 120a may include more metal atoms than silicon atoms. For example, in a case of using Ni for a metal layer, the first pre-metal silicide layer 120a may include $Ni_2Si$ or $NiSi$.

Although not shown, after performing the first thermal process, an unreacted metal layer may be removed. Further, in a case where the first capping layer is formed, the first capping layer and the unreacted metal layer may be simultaneously or sequentially removed.

Next, as shown in FIG. 3, the first pre-metal silicide layer (see 120a of FIG. 2) is changed into the first metal silicide layer 120 by performing a second thermal process. Here, the second thermal process may be performed at a higher temperature than the first thermal process.

More specifically, the first pre-metal silicide layer 120a is changed into the first metal silicide layer 120 by performing the second thermal process. In a case of using Ni for a first metal layer, the first pre-metal silicide layer 120a including, for example, $Ni_2Si$ or NiSi into the first metal silicide layer 120 including, for example, $NiSi_2$. According to the method, the first pre-metal silicide layer 120a is changed into the first metal silicide layer 120 such that a proportion of metal atoms relative to silicon atoms in the first metal silicide layer 120 is greater than 1. In other words, a proportion of silicon atoms relative to metal atoms in the first metal silicide layer 120 may be greater than a proportion of silicon atoms relative to metal atoms in the first pre-metal silicide layer 120a.

The second thermal process may be performed at a higher temperature than the first thermal process. For example, during the second thermal process, the substrate 100 may be heated at a temperature of approximately 400° C. or less, for approximately 20 seconds. In other embodiments, the second thermal process may be performed by, for example, millisecond annealing. Further, the second thermal process may be performed at a peak temperature for a time ranging from approximately 0.1 ns to approximately 10 ms. In still other embodiments, the second thermal process may be performed by, for example, flash annealing or laser annealing.

In addition, a second capping layer may be formed before performing the second thermal process, and the second capping layer may be removed after performing the second thermal process.

Figure 4:
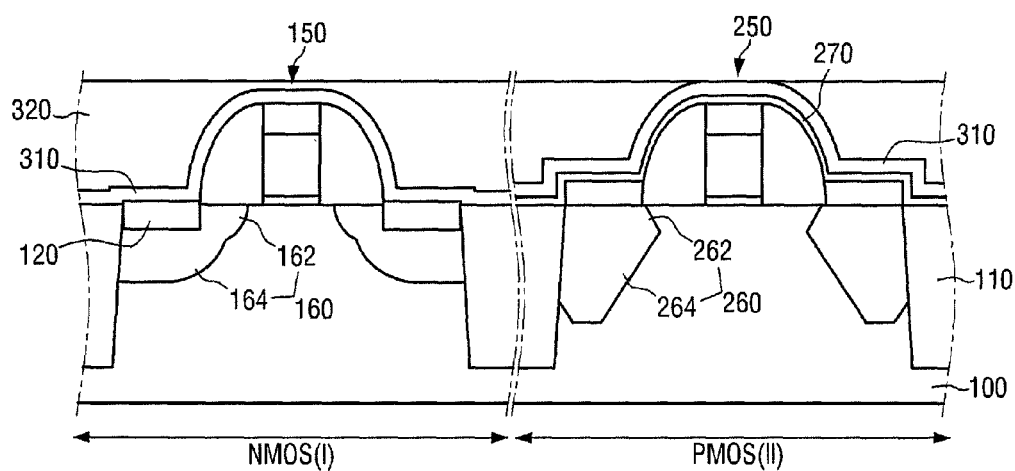

Referring to FIG. 4, an interlayer dielectric (ILD) layer 320 is formed on the first region I and the second region II.

As shown in FIG. 4, an etch stopper layer 310 may further be formed. In other words, the etch stopper layer 310 and the interlayer dielectric layer 320 may be formed on the first region I having the first metal silicide layer 120 and the second region II having the epitaxial layer 220. Here, the etch stopper layer 310 and the interlayer dielectric layer 320 may be formed by, for example, CVD. The etch stopper layer 310 may be, for example, an oxide layer or a nitride layer. The interlayer dielectric layer 320 may also be an oxide layer or a nitride layer.

Next, as shown in FIG. 4, a planarizing process may be performed by performing a CMP process on the substrate 100 having the interlayer dielectric layer 320. For example, a planarizing process may be performed by etching to reach the etch stopper layer 310.

Figure 5:
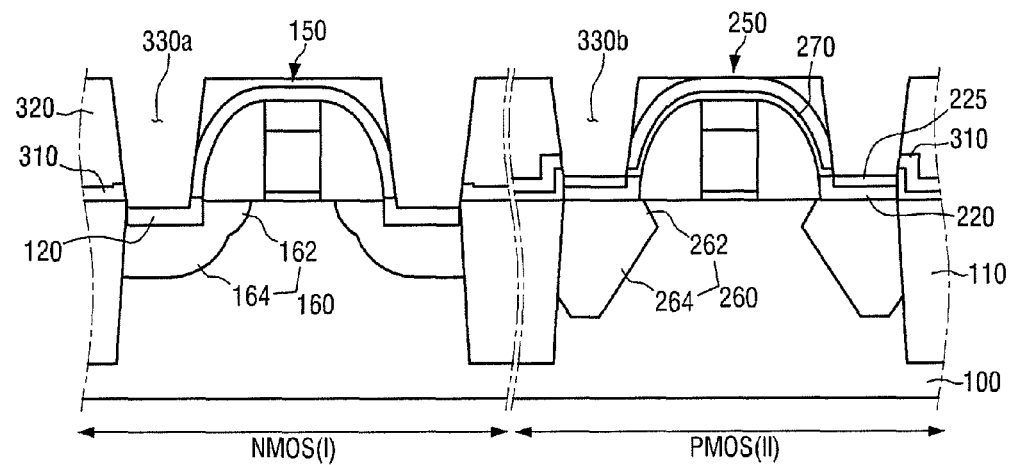

Referring to FIG. 5, a plurality of contact holes 330a and 330b exposing the first metal silicide layer 120 and the epitaxial layer 220, respectively, are formed while penetrating the interlayer dielectric layer 320. A second metal silicide layer 225 is formed on the exposed epitaxial layer 220.

More specifically, the plurality of contact holes 330a and 330b penetrating the interlayer dielectric layer 320 are formed. Here, the first contact hole 330a may expose the first metal silicide layer 120, and the second contact hole 330b may expose the epitaxial layer 220. A top portion of the first metal silicide layer 120 and epitaxial layer 220 may be removed during this process. As described above, when the etch stopper layer 310 is formed under the interlayer dielectric layer 320, the plurality of contact holes 330a and 330b may be formed to penetrate the interlayer dielectric layer 320 and the etch stopper layer 310. The plurality of contact holes 330a and 330b may be formed by, for example, photolithography.

Next, a second metal layer (not shown) contacting the exposed epitaxial layer 220 is formed, and a thermal process is performed on the substrate 100 having the second metal layer at least one time, thereby forming the second metal silicide layer 225. For example, the second metal layer may include any one of Ni, Pt, Ti, Ru, Rh, Co, Hf, Ta, Er, Yb and W, or combinations thereof. Like the first metal layer, the second metal layer may also be formed by, for example, physical vapor deposition (PVD), chemical vapor deposition (CVD), or atomic layer deposition (ALD). A thickness of the second metal layer may be determined in consideration a thickness of the epitaxial layer 220 under the metal layer, which is consumed during third and fourth thermal processes to be performed later. For example, the second metal layer may be formed to a thickness in which the epitaxial layer 220 may not completely be consumed.

Although not shown, the performing the thermal process at least one time may comprise performing a third thermal process on the substrate 100 having the second metal layer to form a second pre-metal silicide layer on the exposed epitaxial layer 220, and performing a fourth thermal process at a higher temperature than the third thermal process to change the second pre-metal silicide layer into the second metal silicide layer 225. After performing the third thermal process, an unreacted second metal layer may be removed, and the fourth thermal process may then be performed to form the stable second metal silicide layer 225.

The removing of the second metal layer may be performed by, for example, known stripping techniques. Here, since the first metal silicide layer 120 is stable with respect to stripping, it may not be damaged due to a thermal process. In other words, since the stable first metal silicide layer 120 is formed by the first and second thermal processes, even in the forming of the second metal layer and the performing of the third thermal process and the stripping, the first metal silicide layer 120 is not silicided due to the second metal layer.

In such a manner, the second metal silicide layer 225 may be formed after forming the first metal silicide layer 120, the interlayer dielectric layer 320, and the plurality of contact holes 330a and 330b. In other words, the first metal silicide layer 120 of the NMOS region I and the second metal silicide layer 225 of the PMOS region II are formed by separate processes, thereby forming a silicide layer having a work function suitable to NMOS and PMOS. Accordingly, the contact resistance with respect to the NMOS and the PMOS can be reduced and operating characteristics of the semiconductor device can be improved.

Figure 6:
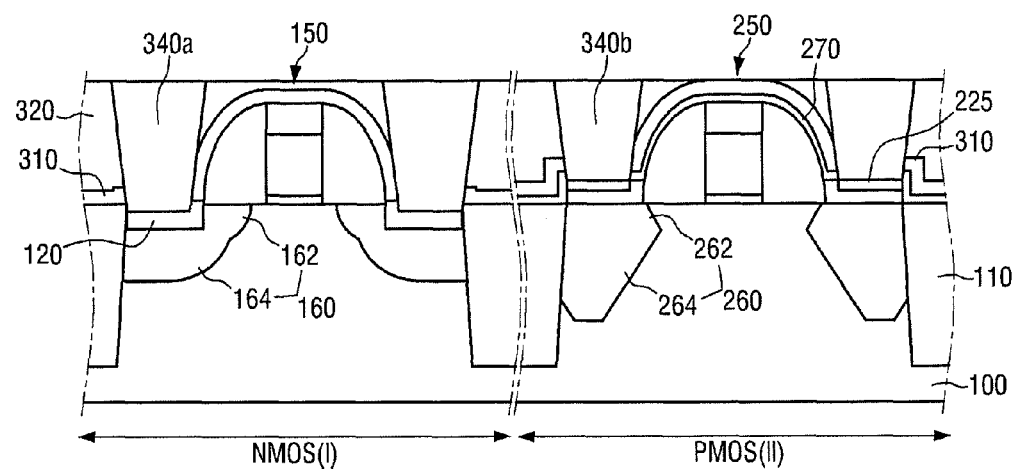

Next, referring to FIG. 6, the plurality of contact holes 330a and 330b are filled to form a plurality of contacts 340a and 340b contacting the first metal silicide layer 120 and the second metal silicide layer 225, respectively. More specifically, in this embodiment, a metal material is deposited to fill the plurality of contact holes 330a and 330b, and a planarizing process is performed to form the plurality of contacts 340a and 340b. The processes that would typically be performed after the method described with respect to FIGS. 1-6 are substantially the same as processes of a general fabricating method of a semiconductor device, and a detailed description thereof will not be given.

Another embodiment of a method fabricating a semiconductor device according to aspects of the present invention will now be described with reference to FIGS. 7 to 12. FIGS. 7 to 12 are cross-sectional views sequentially illustrating intermediate stages in the method of fabricating a semiconductor device according to this embodiment.

The method of fabricating the semiconductor device according to this embodiment is different from the method of FIGS. 1-6 in that an epitaxial layer is formed in a first source and drain region. For convenience of explanation, the following description will focus on the difference, and substantially the same functional components or steps as those of the previous embodiment will not be described in detail or will be briefly described.

Figure 7:
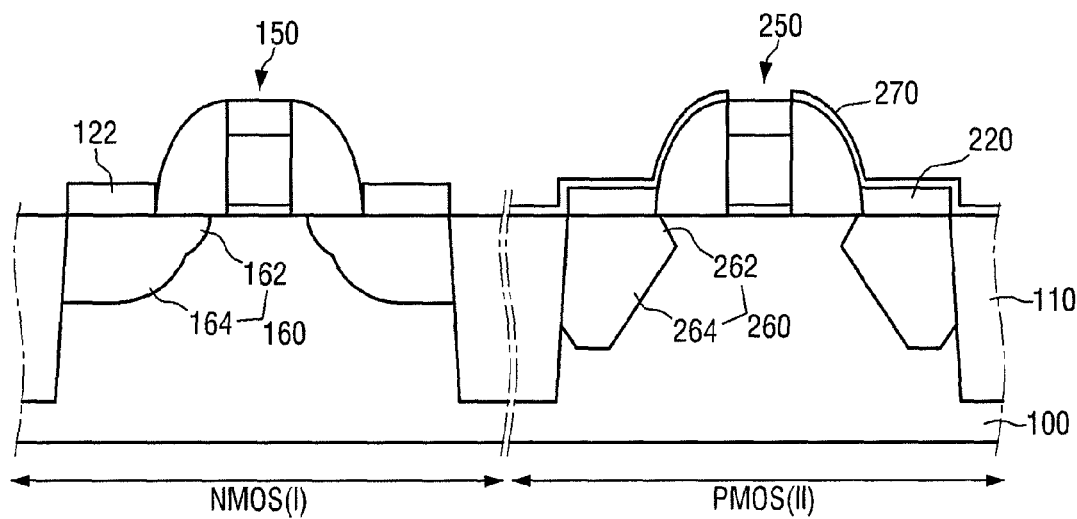
FIGS. 7 to 12 are cross-sectional views sequentially illustrating intermediate stages in another embodiment of a method of fabricating a semiconductor device, according to another aspect of the present invention.
Figure 9:
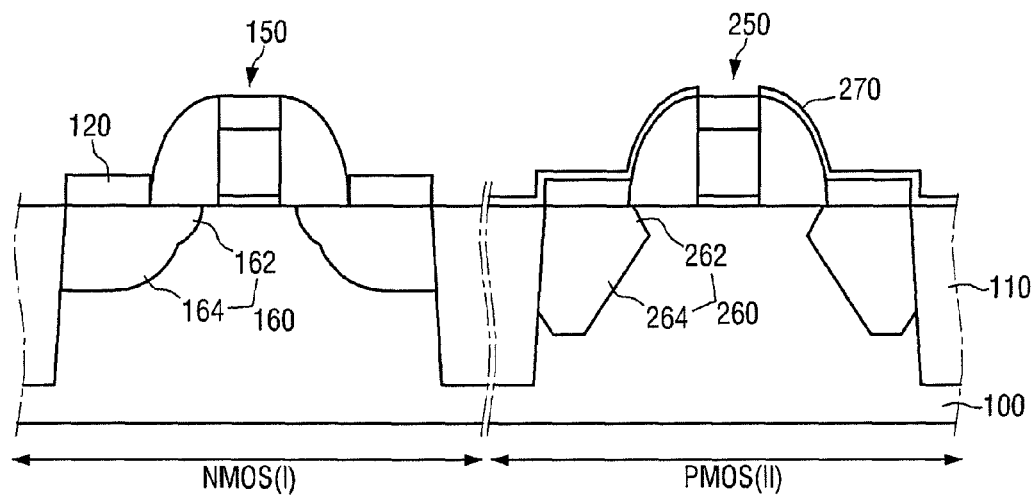

Referring to FIG. 7, a substrate 100 having a first region I and a second region II defined therein is provided. A first gate 150 and a first source and drain region 160 are formed in the first region I, a second gate 250 and a second source and drain region 260 are formed in the second region II, and a first epitaxial layer 122 extending from a top portion of the substrate 100 is formed in the first source and drain region 160, as shown in FIG. 9.

As described above, the first region I may be an NMOS region where an NMOS transistor is formed, and the second region II may be a PMOS region where a PMOS transistor is formed.

As in FIG. 1, a second epitaxial layer 220 may first be formed on the second source and drain region 260 of the second region II. The second epitaxial layer 220 may include or be formed of, for example, SiGe. Next, a blocking layer 270 is formed on the second region II of the substrate 100 having the second epitaxial layer 220, thereby preventing the second epitaxial layer 220 of the PMOS region from being damaged in a subsequent process.

As shown in FIG. 7, the first epitaxial layer 122 extending from a top portion or surface of the substrate 100 may be formed in the first source and drain region 160. For example, the first epitaxial layer 122 may be formed by a selective epitaxial growth process. The first epitaxial layer 122 advantageously improves the performance of an NMOS transistor.

Figure 8:
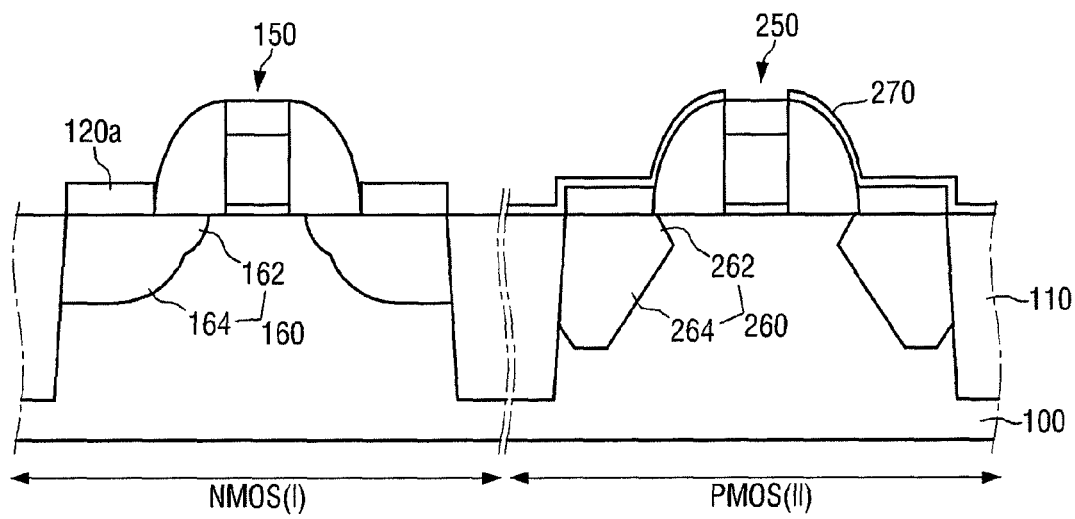

Referring to FIGS. 8 and 9, a first metal silicide layer 120 is formed in the first epitaxial layer 122. Here, the forming of the first metal silicide layer 120 may comprise performing a thermal process on the substrate 100 at least two times.

First, referring to FIG. 8, a first metal layer contacting the first epitaxial layer 122 is formed on the substrate 100 having the blocking layer 270, and a first thermal process is performed, thereby selectively forming a first pre-metal silicide layer 120a in the first epitaxial layer 122. As described above, the blocking layer 270 is formed when the first epitaxial layer 122 is formed, and the first metal layer may be formed on the substrate 100 having the blocking layer 270 formed on the second region II. Since the materials for forming method and thickness of the first metal layer are substantially the same as those of the previous embodiment, a detailed description thereof will not be given.

Like in the previous embodiment, during the first thermal process, the substrate 100 may be heated at a temperature of approximately 350° C. or less, for approximately 20 seconds. Here, the first thermal process may be performed by rapid thermal annealing (RTA). In addition, before performing the first thermal process, a first capping layer (not shown) may be formed on the substrate 100 having the first metal layer.

After performing the first thermal process, an unreacted metal layer may be removed. In a case where the first capping layer is formed, the unreacted metal layer and the first capping layer may be removed simultaneously or sequentially.

Next, referring to FIG. 9, the first pre-metal silicide layer 120a may be changed into the first metal silicide layer 120 by performing a second thermal process.

More specifically, second thermal process may be performed at a higher temperature than the first thermal process. For example, during the second thermal process, the substrate 100 may be heated at a temperature of approximately 400° C. or less, for approximately 20 seconds. In other embodiments, the second thermal process may be performed by, for example, millisecond annealing. Further, the second thermal process may be performed at a peak temperature for a time ranging from approximately 0.1 ns to approximately 10 ms. In still other embodiments, the second thermal process may be performed by, for example, flash annealing or laser annealing. Further, a second capping layer may be formed before performing the second thermal process, and the second capping layer may be removed after performing the second thermal process.

Figure 10:
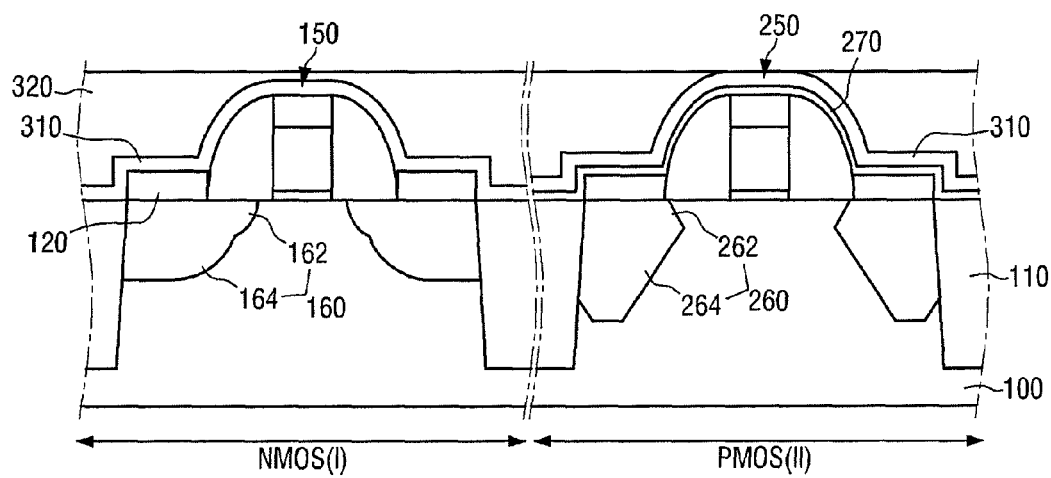

Referring to FIG. 10, an interlayer dielectric layer 320 is formed on the first region I and the second region II. Here, as shown in FIG. 10, an etch stopper layer 310 may further be formed. In other words, the etch stopper layer 310 and the interlayer dielectric layer 320 may be formed on the first region I having the first metal silicide layer 120 and the second region II having the second epitaxial layer 220.

Figure 11:
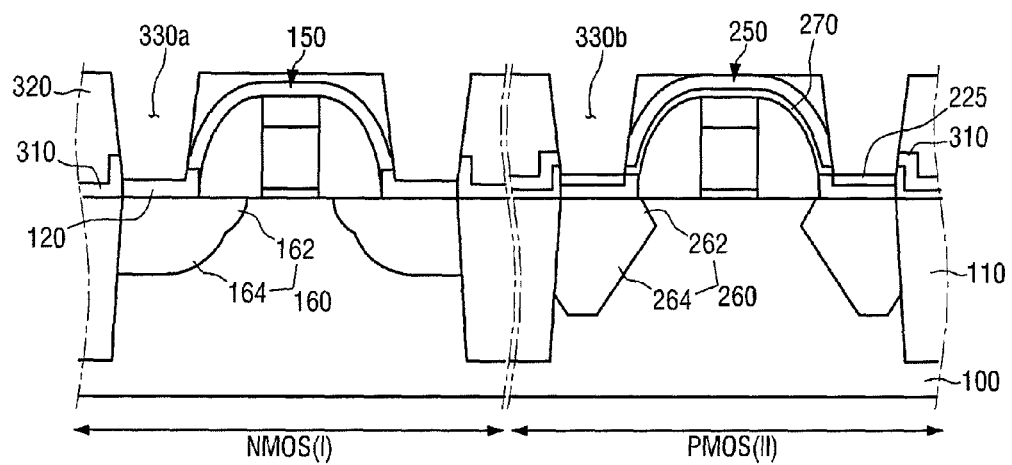

Next, referring to FIG. 11, the plurality of contact holes 330a and 330b penetrating the interlayer dielectric layer 320 are formed and a second metal silicide layer 225 is formed on the exposed epitaxial layer 220.

More specifically, the plurality of contact holes 330a and 330b penetrating the interlayer dielectric layer 320 are formed by, for example, photolithography. Here, the first contact hole 330a may expose the first metal silicide layer 120, and the second contact hole 330b may expose the second epitaxial layer 220. A top portion of the first metal silicide layer 120 and epitaxial layer 220 may be removed during this process. As described above, the plurality of contact holes 330a and 330b may be formed to penetrate the interlayer dielectric layer 320 and the etch stopper layer 310.

Next, a second metal layer contacting the exposed epitaxial layer 220 is formed, and a thermal process is performed on the substrate 100 having the second metal layer at least one time, thereby forming the second metal silicide layer 225. Here, performing the thermal process at least one time may comprise performing a third thermal process on the substrate 100 having the second metal layer to form a second pre-metal silicide layer (not shown) on the exposed epitaxial layer 220, and performing a fourth thermal process at a higher temperature than the third thermal process to change the second pre-metal silicide layer into the second metal silicide layer 225. After the performing of the third thermal process, an unreacted second metal layer may be removed, and the fourth thermal process may then be performed to form the stable second metal silicide layer 225.

Since the first metal silicide layer 120 is in a stable state by the first and second thermal processes, silicide damage is not caused to the first metal silicide layer 120 even in the forming of the second metal layer is formed and the performing of the third thermal process and stripping.

Figure 12:
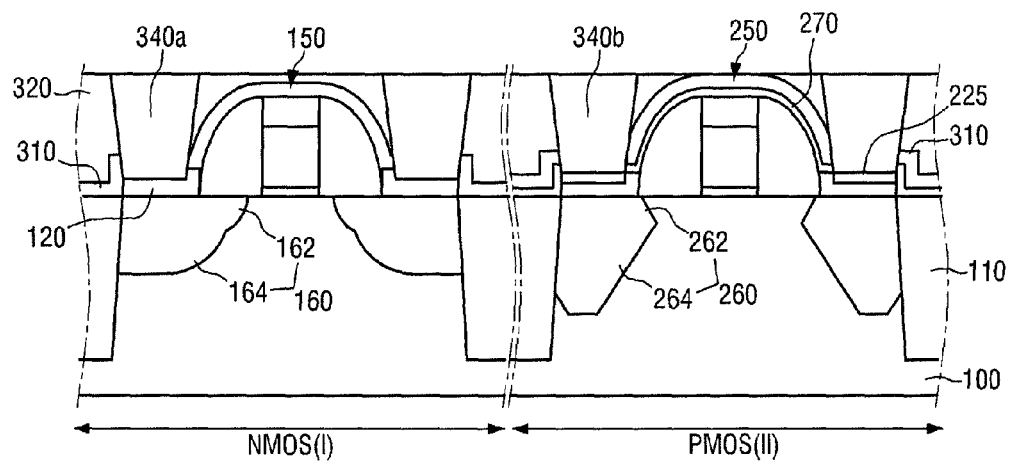

Referring to FIG. 12, the plurality of contact holes 330a and 330b are filled to form a plurality of contacts 340a and 340b contacting the first metal silicide layer 120 and the second metal silicide layer 225, respectively. For example, a metallic material is deposited to fill the plurality of contact holes 330a and 330b, and a planarizing process is performed to form the plurality of contacts 340a and 340b.

As described above, in the method of fabricating a semiconductor device according to this embodiment of the present invention, a first metal silicide layer of a first region and a second metal silicide layer of a second region are formed by separate processes, thereby forming a silicide layer having a work function suitable to an NMOS transistor or a PMOS transistor. In other words, the first metal silicide layer is formed before forming a plurality of contact holes exposing the second epitaxial layer of the second region, and the second metal silicide layer is formed after forming the plurality of contact holes, thereby preventing a transistor formed in, for example, a PMOS region, from deteriorating. That is to say, the contact resistance with respect to NMOS and PMOS can be reduced and operating characteristics of the semiconductor device can be improved.

Another embodiment of method of fabricating a semiconductor device according to aspects of the present invention will now be described with reference to FIGS. 13 to 16. FIGS. 13 to 16 are cross-sectional views sequentially illustrating intermediate stages in the method of fabricating a semiconductor device according to this embodiment of the present invention.

The fabricating method of the semiconductor device according to this embodiment of the present invention is different from the method of the embodiment in FIGS. 7-12 in that first and second gates are formed of first and second high-k metal gates, respectively. For convenience of explanation, the following description will focus on the differences, and substantially the same functional components and steps as those of the previous embodiment will not be described in detail or will be briefly described.

After forming the interlayer dielectric layer 320 in a manner such as that described above with reference to FIGS. 1 to 4, a portion of an interlayer dielectric layer 320 is removed to expose a first gate 150 and a second gate 250.

Figure 13:
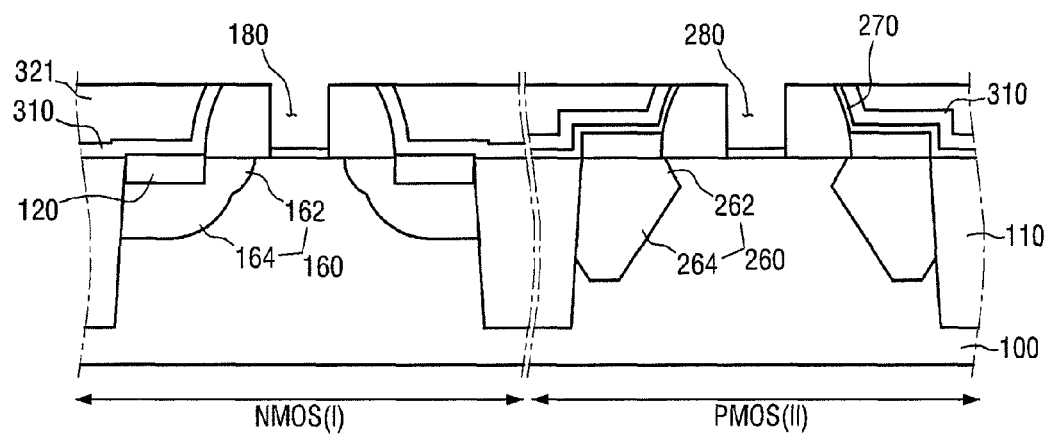
FIGS. 13 to 16 are cross-sectional views sequentially illustrating intermediate stages in another embodiment of a method of fabricating a semiconductor device, according to still another aspect of the present invention.

For example, a planarizing process can be performed to remove the portion of the interlayer dielectric layer 320, leaving reduced interlayer dielectric layer 321. Here, at least portions of the first and second gate masks (see 156 and 256 of FIG. 1) may be removed. Next, first and second gate electrodes (see 154 and 254 of FIG. 1) are removed by performing wet etching and/or dry etching, thereby forming first and second recesses 180 and 280. As shown in FIG. 13, the first recess 180 may be formed in a region from which the first gate electrode 154 is removed, and the second recess 280 may be formed in a region from which the second gate electrode 254 is removed.

Figure 14:
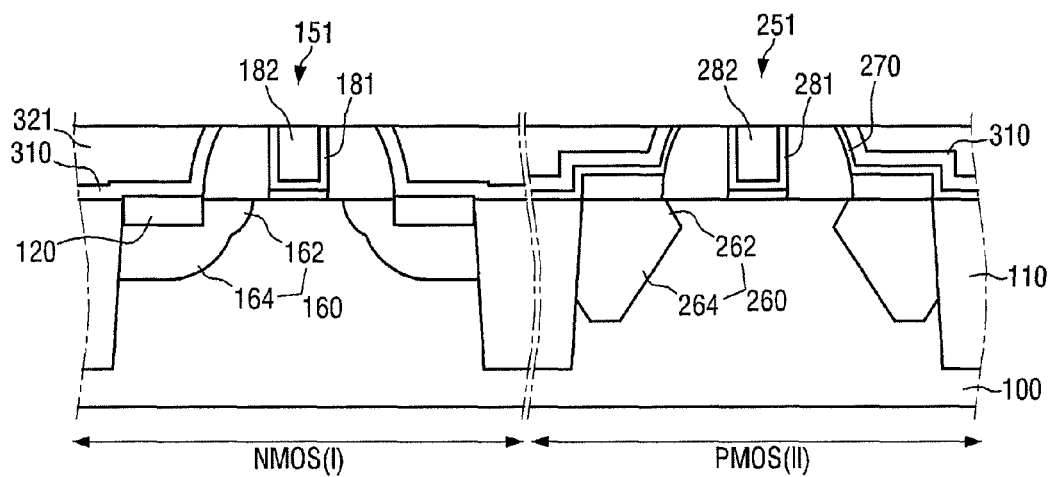

Next, referring to FIG. 14, high-k dielectric materials 181 and 281 are conformally formed on the bottom surface and opposite sidewalls of the first and second recesses 180 and 280 and metallic materials 182 and 282 are formed on the high-k dielectric materials 181 and 281 to fill the first and second recesses 180 and 280, thereby forming the first and second high-k metal gates 151 and 251, respectively.

More specifically, the high-k dielectric materials 181 and 281 may be formed on the bottom surface and opposite sidewalls of the first and second recesses 180 and 280 by CVD or PVD. Here, the high-k dielectric material 181 and 281 may include, for example, Hf or Zr. In addition, a thin film may be formed along inner sidewalls of the first and second recesses 180 and 280 using the high-k dielectric material 181 and 281, thereby leaving a space for a metal gate to be formed inside the first and second recesses 180 and 280.

Next, the space left inside the first and second recesses 180 and 280 is filled with the metallic material 182 and 282, and a planarizing process is performed, thereby forming first and second high-k metal gates 151 and 251, respectively. The metallic material 182 and 282 may include, for example, Hf or Zr.

Figure 15:
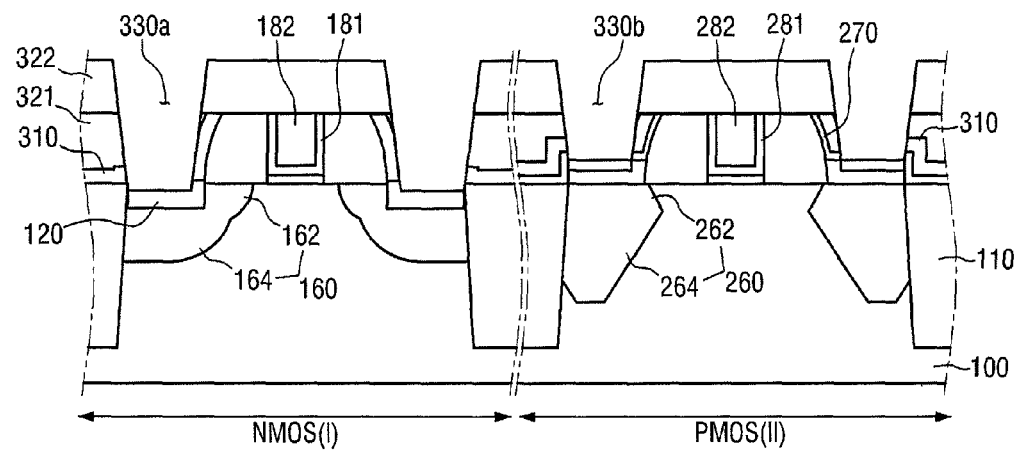

Referring to FIG. 15, a plurality of contact holes 330a and 330b exposing the first metal silicide layer 120 and the second epitaxial layer 220 while penetrating a plurality of interlayer dielectric layers 321 and 322, are formed on the substrate 100 having the first and second high-k metal gates 151 and 251, respectively, and a second metal silicide layer 225 is formed on the exposed second epitaxial layer 220.

First, an additional interlayer dielectric layer 322 may be formed on the substrate 100 having the first and second high-k metal gates. Next, a plurality of contact holes 330a and 330b penetrating the interlayer dielectric layers 321 and 322 may be formed by, for example, photolithography. Here, the plurality of contact holes 330a and 330b may be formed to penetrate the plurality of interlayer dielectric layers 321 and 322, an etch stopper layer 310, and a blocking layer 270. As the result, first metal silicide layer 120 and the second epitaxial layer 220 may be exposed by the plurality of contact holes 330a and 330b. A top portion of the first metal silicide layer 120 and epitaxial layer 220 may be removed during this process.

Although not shown, a second metal layer contacting the exposed second epitaxial layer 220 is formed on the substrate 100, and a thermal process is performed on the substrate 100 having the second metal layer at least one time, thereby forming the second metal silicide layer 225 on the second epitaxial layer 220. Here, the steps of performing the thermal process at least one time and the forming of the second metal silicide layer 225 are substantially the same as those of the previous embodiments, and a detailed description thereof will not be given. The first metal silicide layer 120 and the second metal silicide layer 225 may be formed in different processing stages. That is to say, the first metal silicide layer 120 of the first region I and the second metal silicide layer 225 of the second region II may be formed in temporally different processing stages.

Figure 16:
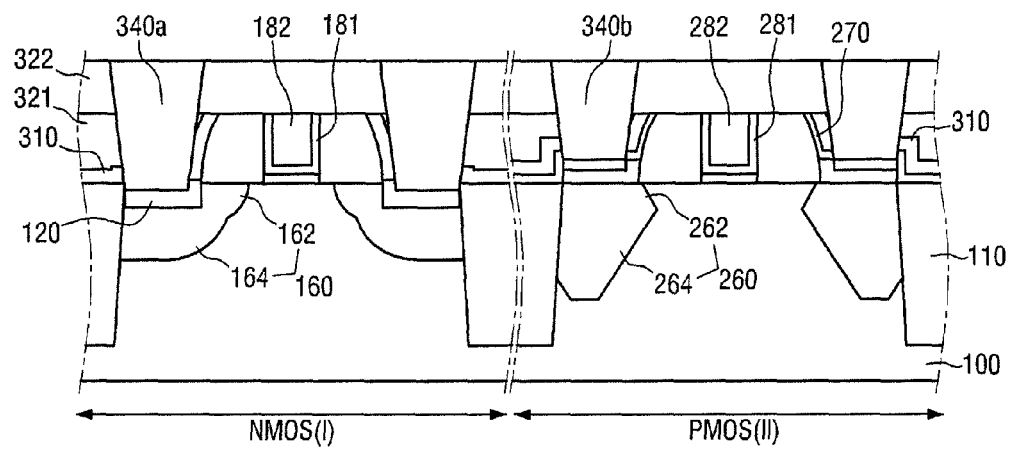

Referring to FIG. 16, the plurality of contact holes 330a and 330b are filled to form the plurality of contacts 340a and 340b contacting the first and second metal silicide layers 120 and 225, respectively. More specifically, the plurality of contact holes 330a and 330b are filled with metallic materials, and a planarizing process is performed, thereby forming contacts 340a and 340b electrically connected to the first and second metal silicide layers 120 and 225.

As described above, in the method fabricating of a semiconductor device according to this embodiment, silicide layers having work functions suitable for transistors formed in the respective regions, i.e., an NMOS transistor and a PMOS transistor, can be formed. That is to say, the contact resistance with respect to NMOS and PMOS can be reduced and operating characteristics of the semiconductor device can be improved. Further, a high-k metal gate is formed, thereby preventing current leakage.

Hereinafter, another embodiment of a method of fabricating a semiconductor device according to aspects of the present invention will be described with reference to FIGS. 7 to 9 and FIGS. 17 to 20. FIGS. 17 to 20 are cross-sectional views sequentially illustrating intermediate stages in the method of fabricating a semiconductor device.

This method of fabricating the semiconductor device is different from the method of fabricating the semiconductor device according to the previous embodiments in that an epitaxial layer is formed in a first source and drain region and first and second gates are formed of first and second high-k metal gates, respectively. For convenience of explanation, the following description will focus on the differences, and substantially the same functional components and steps as those of the previous embodiments will not be described in detail or will be briefly described.

Figure 17:
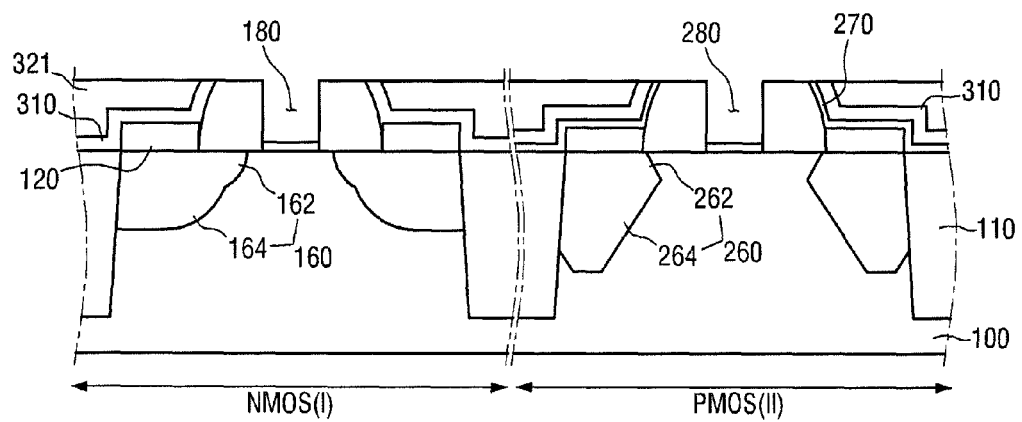
FIGS. 17 to 20 are cross-sectional views sequentially illustrating intermediate stages in another embodiment of a method of fabricating a semiconductor device, according to still another aspect of the present invention.

After forming the interlayer dielectric layer 320 in a manner such as that described above with reference to FIGS. 7 to 10, a portion of the interlayer dielectric layer 320 is removed to expose a first gate 150 and a second gate 250 with reference to FIG. 17. This leaves reduced interlayer dielectric layer 321, exposing the first gate 150 and the second gate 250.

For example, a planarizing process is performed to remove the portion of the interlayer dielectric layer 320, to form the reduced interlayer dielectric layer 321. Here, at least portions of the first and second gate masks 156 and 256 may be removed (e.g., see FIG. 7). Next, first and second gate electrodes 154 and 254 are removed by performing wet etching and/or dry etching, thereby forming first and second recesses 180 and 280, respectively. As shown in FIG. 17, the first recess 180 may be formed in a region from which the first gate electrode 154 is removed, and the second recess 280 may be formed in a region from which the second gate electrode 254 is removed.

Figure 18:
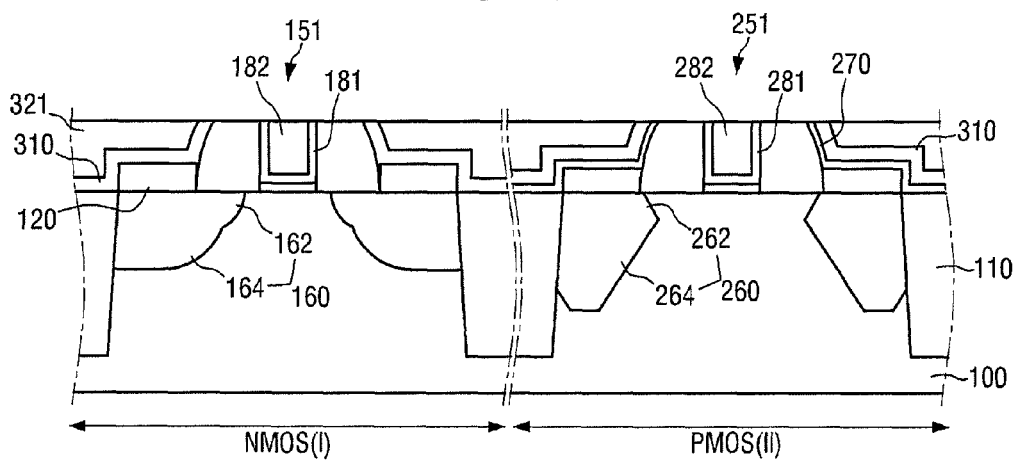

Next, referring to FIG. 18, high-k dielectric materials 181 and 281 are conformally formed on the bottom surface and opposite sidewalls of the first and second recesses 180 and 280 and metallic materials 182 and 282 are formed on the high-k dielectric materials 181 and 281 to fill the first and second recesses 180 and 280, thereby forming the first and second high-k metal gates, 151 and 251, respectively. Since the forming methods of the first and second high-k metal gates have been described above in the previous embodiments, a detailed description thereof will not be given.

Figure 19:
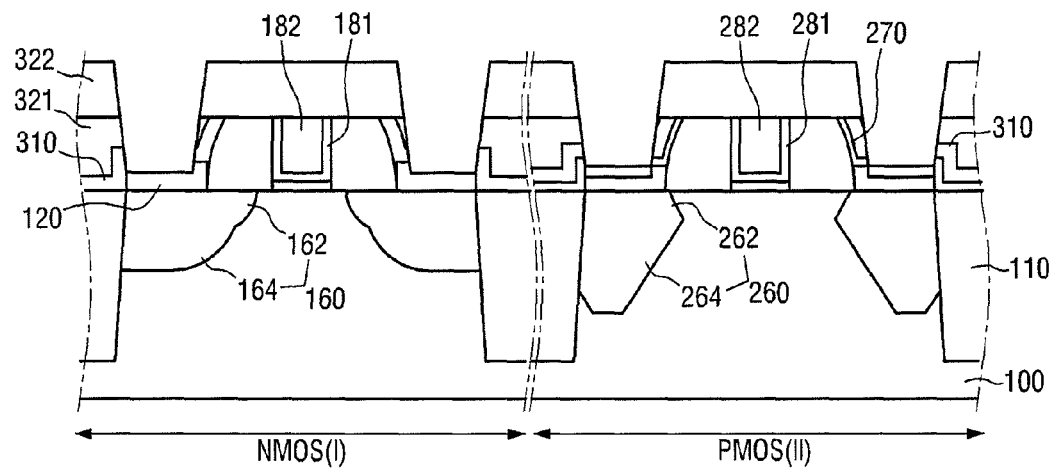

Referring to FIG. 19, a plurality of contact holes 330a and 330b exposing the first metal silicide layer 120 and the second epitaxial layer 220 while penetrating the interlayer dielectric layers 321 and 322 are formed on the substrate 100 having the first and second high-k metal gates, and a second metal silicide layer 225 is formed on the exposed second epitaxial layer 220.

Figure 20:
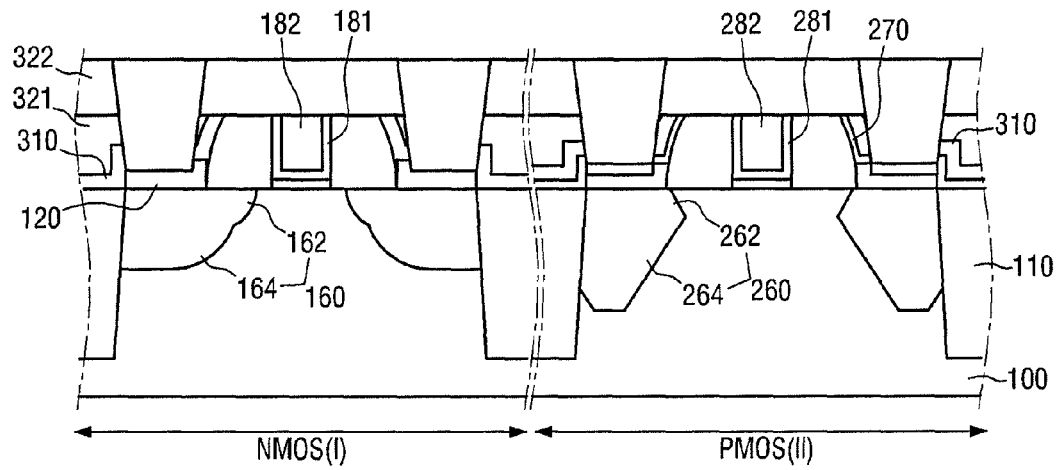

Next, referring to FIG. 20, the plurality of contact holes 330a and 330b are filled to form the plurality of contacts 340a and 340b contacting the first and second metal silicide layers 120 and 225, respectively. More specifically, the plurality of contact holes 330a and 330b are filled with the metallic material 182 and 282, and a planarizing process is performed, thereby forming contacts 340a and 340b electrically connected to the first and second metal silicide layers 120 and 225.

As described above, in the fabricating method of a semiconductor device according to this embodiment, silicide layers having work functions suitable for transistors formed in the respective regions, i.e., an NMOS transistor and a PMOS transistor, can be formed. That is to say, the contact resistance with respect to NMOS and PMOS can be reduced and operating characteristics of the semiconductor device can be improved. Further, a high-k metal gate is formed, thereby preventing current leakage.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, comprising:
    providing a substrate having a first region and a second region defined therein;
    forming a first gate and a first source and drain region in the first region and forming a second gate and a second source and drain region in the second region;
    forming an epitaxial layer in the second source and drain region;
    forming a first metal silicide layer in the first source and drain region;
    forming an interlayer dielectric layer on the first region and the second region;
    forming a plurality of contact holes exposing the first metal silicide layer and the epitaxial layer by penetrating the interlayer dielectric layer;
    forming a second metal silicide layer in the exposed epitaxial layer; and
    forming a plurality of contacts contacting the first and second metal silicide layers by filling the plurality of contact holes.

2. The method of claim 1, wherein the forming of the second metal silicide layer comprises forming the second metal silicide layer after forming the first metal silicide layer, the interlayer dielectric layer, and the plurality of contact holes.

3. The method of claim 1, wherein the forming of the first metal silicide layer comprise performing at least two thermal processes on the substrate.

4. The method of claim 3, wherein the performing of the at least two thermal processes comprises:
    forming a blocking layer on the substrate in the second region;
    forming a first metal layer contacting the first source and drain region on the substrate having the blocking layer;
    selectively forming a first pre-metal silicide layer in the first source and drain region by performing a first thermal process; and
    changing the first pre-metal silicide layer into the first metal silicide layer by performing a second thermal process at a higher temperature than the first thermal process.

5. The method of claim 4, wherein the changing of the first pre-metal silicide layer into the first metal silicide layer comprises changing the first pre-metal silicide layer into the first metal silicide layer such that a proportion of silicon atoms relative to metal atoms of the first metal silicide layer is greater than a proportion of silicon atoms relative to metal atoms of the first pre-metal silicide layer.

6. The method of claim 1, wherein the forming of the second metal silicide layer comprises:
    forming a second metal layer contacting the exposed epitaxial layer; and
    performing at least one thermal process on the substrate.

7. The method of claim 6, wherein the performing of the at least one thermal process comprises:
    forming a second pre-metal silicide layer on the exposed epitaxial layer by performing a first thermal process on the substrate having the second metal layer; and
    changing the second pre-metal silicide layer into the second metal silicide layer by performing a second thermal process at a higher temperature than the first thermal process.

* * * * *